United States Patent
Knoedgen et al.

(10) Patent No.: US 10,110,216 B1
(45) Date of Patent: Oct. 23, 2018

(54) OVER VOLTAGE PROTECTION OF A TRANSISTOR DEVICE

(71) Applicant: Dialog Semiconductor (UK) Limited, London (GB)

(72) Inventors: Horst Knoedgen, Munich (DE); Christoph Nagl, Graz (AT); Nebojsa Jelaca, Graz (AT)

(73) Assignee: Dialog Semiconductor (UK) Limited, London (GB)

( * ) Notice: Subject to any disclaimer, the term of this patent is extended or adjusted under 35 U.S.C. 154(b) by 0 days.

(21) Appl. No.: 15/638,973

(22) Filed: Jun. 30, 2017

(51) Int. Cl.
*H02H 3/20* (2006.01)
*H03K 17/082* (2006.01)
*H02H 7/20* (2006.01)
*H02H 1/00* (2006.01)

(52) U.S. Cl.
CPC ....... *H03K 17/0822* (2013.01); *H02H 1/0007* (2013.01); *H02H 7/205* (2013.01); *H03K 17/0826* (2013.01)

(58) Field of Classification Search
USPC .................................................. 361/86, 91.1
See application file for complete search history.

(56) References Cited

U.S. PATENT DOCUMENTS

| 6,097,237 | A | * | 8/2000 | Singh ............... H03K 19/00315 326/27 |
| 7,710,701 | B1 | | 5/2010 | Mei et al. |
| 2007/0257645 | A1 | | 11/2007 | Nishino |
| 2013/0127500 | A1 | * | 5/2013 | Kobayashi ......... H03K 17/0822 327/109 |
| 2014/0327010 | A1 | | 11/2014 | Pendharkar et al. |
| 2015/0155863 | A1 | * | 6/2015 | Takasu ............. H03K 17/08142 327/108 |
| 2017/0365995 | A1 | * | 12/2017 | Bahl .................... H02H 1/0007 |

* cited by examiner

*Primary Examiner* — Ronald W Leja
(74) *Attorney, Agent, or Firm* — Saile Ackerman LLC; Stephen B. Ackerman

(57) ABSTRACT

An once a channel voltage exceeds a threshold, when the transistor is in an OFF state. This is over-voltage protection circuit for a transistor is presented. This circuit acts to switch on the transistor achieved with internal components which are integrated with the transistor, avoiding the need for external diodes or Zener structures. The circuit has a transistor with a control terminal, a first current carrying terminal and a second current carrying terminal. The over-voltage protection circuit has a level shifter arranged to feed back a level-shifted version of a channel voltage between said first and second current carrying terminals to the control terminal. The level shifter allows the switching threshold voltage of the transistor to be crossed when a predetermined value of the channel voltage is crossed.

27 Claims, 8 Drawing Sheets

OVER VOLTAGE PROTECTION OF A TRANSISTOR DEVICE

BACKGROUND

Technical Field

The present disclosure is in the field of electronic circuitry. More specifically, it relates to over voltage protection of a transistor device.

Background

A transistor device is an electronic device used to amplify or switch electronic signals or electrical power. A transistor device comprises three electrodes known as terminals comprising a control terminal and first and second current carrying terminals which between them define a current-carrying channel. A voltage or current applied to one pair of terminals controls the current through another pair of terminals; and a small current applied to a control terminal can control or switch a much larger current between the current carrying terminals.

When used as a switch, a transistor is in an "on" state when current flows through a channel between the current carrying terminals, and is in an "off" state when current is prevented from flowing through the channel. Transition between the on and off states is controlled by a current or voltage applied via the control terminal.

Examples of transistor devices include bipolar junction transistors (BJTs) and field effect transistors (FETs). A BJT has a control terminal known as a base, and current carrying terminals known as collector and emitter terminals. An FET has a control terminal known as a gate, and current carrying terminals known as source and drain terminals. FETs can be formed with various semiconductor materials. The most common is silicon although FETs may also be formed with organic semiconductors such as such as silicon carbide (SiC), gallium arsenide (GaAs), gallium nitride (GaN), and indium gallium arsenide (InGaAs).

In general, it is essential to avoid exceeding the maximum rated voltage of a transistor device in order to avoid failure of that device. To avoid this, it is known to simply operate the transistor at a much lower voltage. However, this means that the capabilities of the transistor are not fully realised.

Another solution is to provide an external diode to clamp a channel voltage between the current carrying terminals, but this external diode dissipates energy and so reduces overall power efficiency.

It also known to use an external circuit using a Zener structure to place the transisotor in an ON state when a fixed channel voltage threshold is exceeded. But the use of such an external component is expensive.

SUMMARY

According to a first aspect of the present disclosure there is provided a circuit comprising: a transistor comprising a control terminal, a first current carrying terminal and a second current carrying terminal; and an over-voltage protection circuit comprising: a level shifter arranged to feed back a level-shifted version of a channel voltage between said first and second current carrying terminals to the control terminal; wherein the level shifter is configured so that a switching threshold voltage of the transistor is crossed when a predetermined value of the channel voltage is crossed.

Optionally, the level shifter comprises components which are provided together with the transistor as part of the same integrated circuit.

Optionally, the level shifter comprises a resistive component and a current source arranged to provide a divided voltage version of the channel voltage; and the level shifter is configured according to the ratings of the resistive component and the current source.

Optionally, a control terminal voltage tracks the variation of the channel voltage.

Optionally, the level shifter is coupled directly the control terminal.

Optionally, the circuit further comprises a controller arranged to provide control signals to the control terminal, and wherein an output of the level shifter is coupled to said controller.

Optionally, the circuit further comprises a driver for driving the control terminal and wherein an output of the level shifter is coupled to said driver.

Optionally, the circuit further comprises a selector switch which is operable to selectively enable or disable the over-voltage protection circuit.

Optionally, the predetermined value of the channel voltage is adaptable.

Optionally, the predetermined value of the channel voltage is adjusted based on detection of the presence of a supply voltage.

Optionally, the predetermined value of the channel voltage is adjusted based on the value of a system input voltage.

Optionally, the predetermined value of the channel voltage increases with increasing system input voltage.

Optionally, the transistor is a GaN device.

According to a second aspect of the present disclosure there is provided a power converter circuit comprising a power transistor comprising a control terminal, a first current carrying terminal and a second current carrying terminal; and an over-voltage protection circuit comprising: a level shifter arranged to feed back a level-shifted version of a channel voltage between said first and second current carrying terminals to the control terminal; wherein the level shifter is configured so that a switching threshold voltage of the transistor is crossed when a predetermined value of the channel voltage is crossed.

According to a third aspect of the present disclosure there is provideda method of protecting a transistor from an over-voltage condition, said transistor being of the type comprising a control terminal, a first current carrying terminal and a second current carrying terminal; the method comprising: feeding back a level-shifted channel voltage between said first and second current carrying terminals to the control terminal; and switching the transistor on once a predetermined value of the channel voltage is crossed.

BRIEF DESCRIPTION OF THE DRAWINGS

The disclosure will be described below, by way of example only, with reference to the accompanying drawings, in which.

DESCRIPTION

Each transistor has a specified maximum rated voltage, which is a maximum channel voltage for which correct operation is guaranteed by the manufacturer. The channel voltage is a voltage across the channel defined by the current carrying terminals, which in the example of a FET is denoted as $V_{DS}$ (drain-source voltage) and in the example of a BJT is denoted as $V_{CE}$ (collector-emitter voltage).

Every circuit design consideration must be made in order to operate within the rated maximum channel voltage of a transistor. Many traditional transistor devices including metal oxide semiconductor field effect transistor (MOSFET) exhibit avalanche capabilities, meaning that when they are in an off state, they will still conduct when the channel voltage reaches an avalanche voltage. The avalanche conduction of the transistor acts to reduce the stresses on the transistor caused by the high channel voltage and thus makes them less susceptible to high channel voltage conditions.

Figure 1:
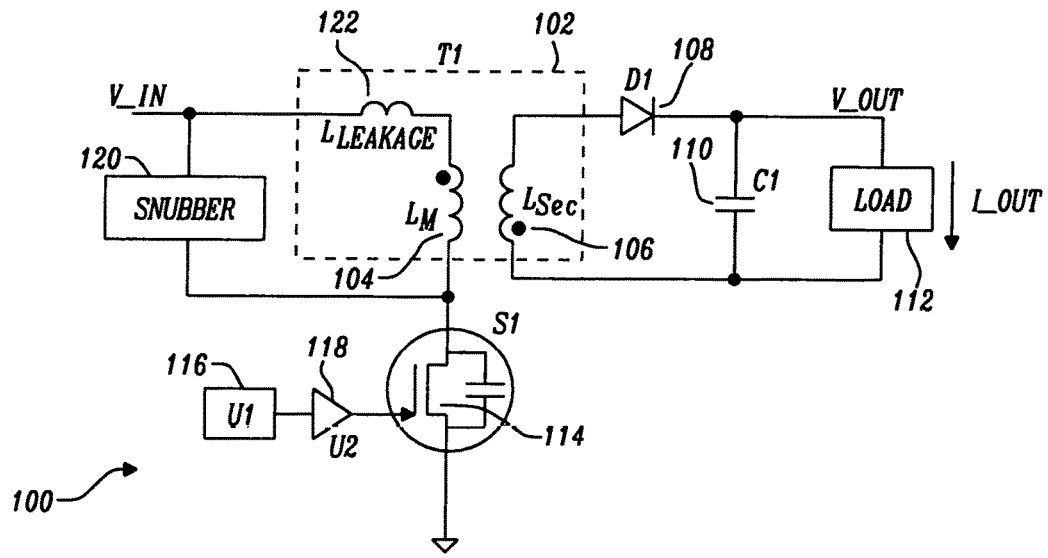
FIG. 1 shows a prior art flyback converter.

To illustrate this point, FIG. 1 shows a prior art flyback converter 100. Here, a transformer 102 (T1) with a primary winding 104 (LM) and secondary winding 106 (LSEC) converts an input voltage V_IN to an output voltage V_OUT. The output from the transformer 102 is rectified by diode 108 (D1) and capacitor 110 (C1) to drive a load 112.

A buck-boost operation of the converter 100 is controlled by a power switch 114 which is operated by a controller 116 (U1) and driver 118 (U2) to selectively couple and decouple the primary winding 104 with the input voltage V_IN. The controller 116 will also receive feedback from the output voltage V_OUT for regulating the output voltage or current power regulation. The diagram also shows a snubber 120 which protects against transient voltages, and the leakage inductance 122 associated with the primary winding 104.

The power transistor 114 is a MOSFET transistor which exhibits an avalanche capability as mentioned above. A "power transistor" or equivalently "power switch" is similar to a regular transistor in terms of its basic functional principles, but is constructed to operate with relatively high channel current and higher voltages.

The power transistor 114 (S1) is subjected to high $V_{DS}$ voltage levels when initially placed in the OFF state. This is generally referred to as the flyback voltage and is generally caused by the parasitic elements of the power converter 100 components.

Figure 2:
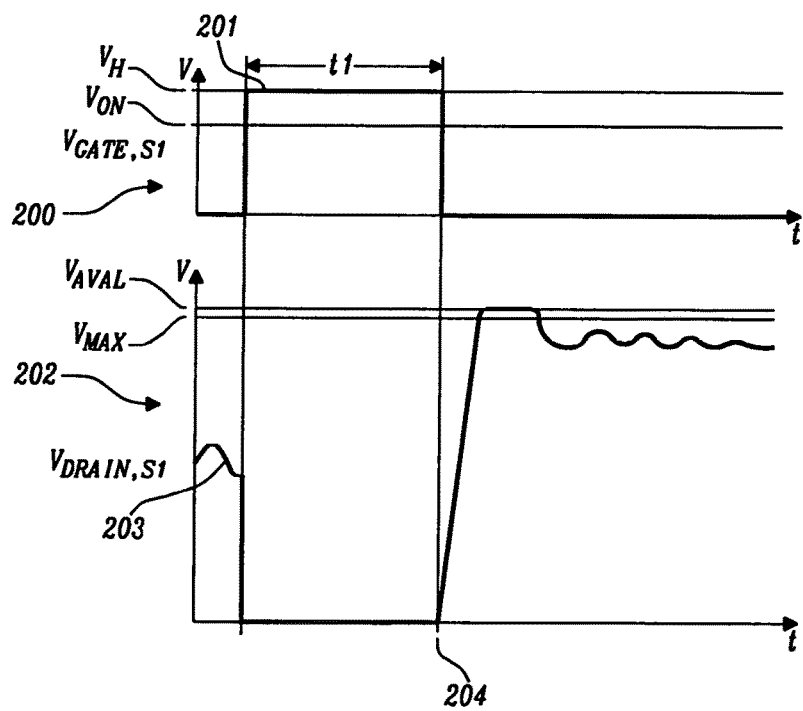
FIG. 2 shows aspects of the operation of the flyback converter of FIG. 1.

FIG. 2 illustrates waveforms associated with the flyback converter 100 of FIG. 1. A first plot 200 illustrates variation of a gate voltage 201 of the power transistor 114 (S1) over time, and a second plot 202 illustrates variation of a channel voltage 203 of the power transistor 114 (S1) over time. The gate voltage 201 is varied in response to signals from gate control circuitry which in this example includes a controller 116 and driver 118. The gate control circuitry 116, 118 asserts a "high" voltage signal during time period t1 which holds the transistor 114 in an "on" state, in which current is allowed to flow in the channel between the current carrying terminals. The transistor 114 will transition between an OFF state to an ON state once a threshold voltage $V_{ON}$ is crossed by a drive signal. The value of the logic high signal, $V_H$, is slightly greater than the threshold voltage $V_{ON}$ so that small variations in the drive signal do not result in unpredictable behaviours.

As shown in the second plot 202, when the transistor 114 is in the ON state, the channel voltage 203 is zero, as the channel is conducting. When the power transistor 114 (S1) is placed in the OFF state, at time 204, the voltage across the transistor ($V_{DS}$) begins to rise.

The transistor 114 has a rated maximum channel voltage $V_{MAX}$. If the $V_{DS}$ voltage exceeds $V_{MAX}$, then an avalanche breakdown occurs, represented as the $V_{DS}$ reaching an avalanche threshold $V_{AVAL}$, and then the transistor device 114 will begin to conduct which reduces $V_{DS}$ and so the device in effect is self-protected. The avalanche voltage $V_{AVAL}$ is usually slightly above the specified absolute maximum rating of the transistor 114, $V_{MAX}$ although whether it is below, above or equal to the maximum rated voltage will depend on how a specific device manufacturer specifies their data sheet and on tolerances in the transistor's characteristic parameters.

Once the avalanche voltage $V_{AVAL}$ is exceeded and while the switch 114 is still in an OFF state, the channel voltage $V_{DS}$ varies due to the design of the flyback circuit 100. The figure also illustrates a short delay between the $V_{DS}$ crossing the threshold $V_{AVAL}$ and starting to decrease. This is due to the specific characteristics of the flyback converter 100 and it will be appreciated in other embodiments of the disclosure that this delay could be effectively zero.

Figure 3:
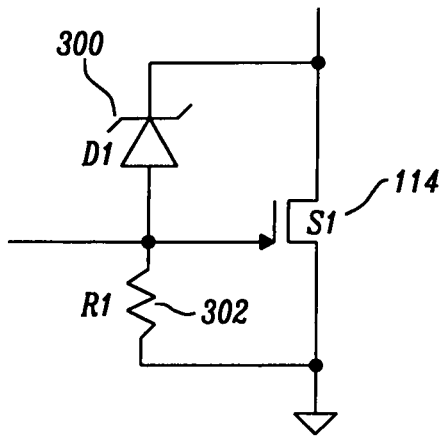
FIG. 3 shows a prior art external circuit for protecting a transistor from high voltage conditions.

An external circuit can be provided to protect a transistor from high voltage conditions. An example is shown in FIG. 3, shown here incorporated with the transistor 114 (S1) of FIG. 1. The remainder of the components of FIG. 1 have been omitted for clarity.

The external circuit comprises a Zener diode 300 (D1) and a resistor 302 (R1), which place the transistor 114 (S1) in the ON state when the Zener threshold is exceeded.

As mentioned above, the Zener diode 300 dissipates energy, which means that the protection afforded by the external circuit comes at the price of a drain in the efficiency of the overall circuit.

Transistors, including power transistors, have for a long time predominantly been formed from silicon or its derivitates. However, Gallium Nitride (GaN) has recently been attracting attention as an alternative material because of its superior electrical characteristics. However, while a GaN based high electron mobility transistor (HEMT) enables smaller form factor designs and higher efficiency, careful attention must be placed to protect the device against over-voltage surges. Today there are no solutions that do so.

Figure 4:
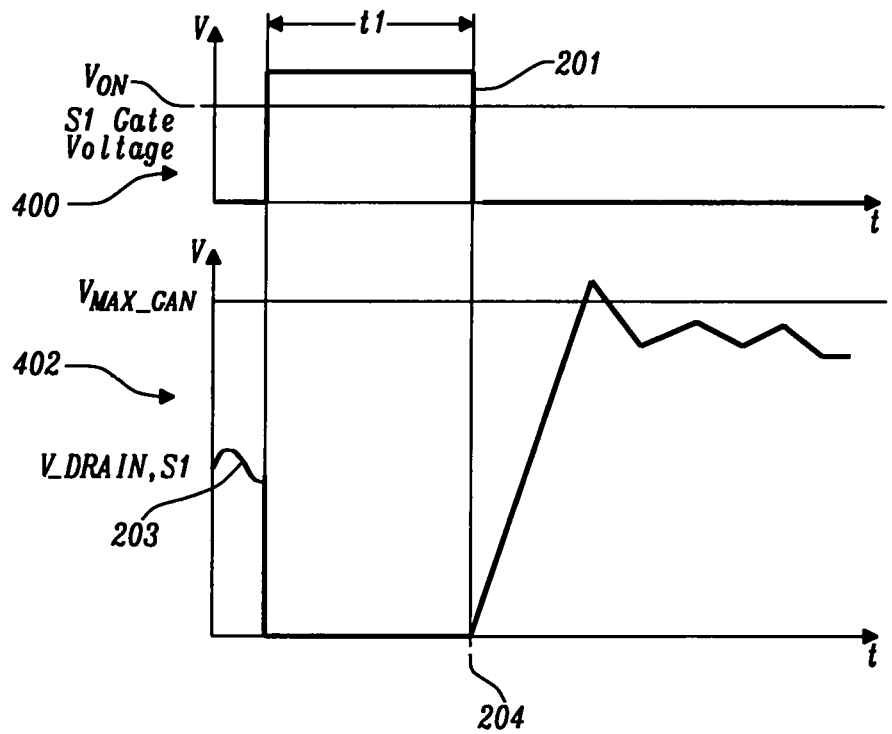
FIG. 4 shows aspects of the operation of the flyback converter of FIG. 1, where the power transistor is a GaN transistor device.

Furthermore, GaN transistors have no avalanche capability and special attention must be taken to protect GaN transistor devices from the high drain voltages, as they cannot "self-protect" in the manner described above with reference to FIG. 2. This is illustrated in FIG. 4, which shows waveforms associated with the flyback converter 100 of FIG. 1 if we assume that a MOSFET transistor 114 is replaced with a GaN device.

In a manner similar to that of FIG. 2 above, a first plot 400 illustrates variation of a gate voltage 201 of the power transistor 114 (S1) over time, and a second plot 402 illustrates variation of a channel voltage 203 of the power transistor 114 (S1) over time.

Again, when the power transistor 114 (S1) is placed in the OFF state, at time 204, the voltage across the transistor ($V_{DS}$) begins to rise. In certain operating conditions (for example, a high input line voltage), the flyback voltage exceeds the maximum rated $V_{DS}$ voltage for S1, $V_{MAX\_GAN}$, potentially causing non-optimal operation or a complete failure of the transistor 114 (S1).

Furthermore, in the GaN process, no Zener structure is available, so the external circuit of FIG. 3 cannot be provided.

There are also other semiconductor materials besides GaN which can be used for transistors which do not possess an avalanche capability, and/or for which no Zener structures are available.

The present disclosure provides an over-voltage protection circuit for transistor devices. An "over-voltage" is a condition in which a given voltage exceeds a desired threshold, and so an over-voltage protection circuit provides components which prevent this threshold being exceeded, or minimise the time when it is exceeded to protect a transistor device. The disclosure is especially useful for transistors without avalanche capabilities, such as GaN devices, but does in fact provide benefits for any kind of transistor.

An over-voltage protection circuit according to the disclosure acts to place the transistor in a conducting mode when an over-voltage condition is detected. It does so using integrated components rather than relying on external circuits.

The protection can be achieved by feeding back a level-shifted version of a channel voltage as an input contribution to the control terminal. Level shifting means that a scaled version of the channel voltage is presented to the control terminal. This is necessary because the voltage across a channel of the transistor, between its current carrying terminals, will usually be much higher (say by two or more orders of magnitude) than the voltage at which a control terminal operates.

An over-voltage circuit according to the disclosure may also allow for a control terminal voltage of a transistor to track the shape of the channel voltage while the transistor is kept in an OFF state. That is, the control terminal voltage will track the variation of the channel voltage, meaning that it will rise and fall in conjunction with the rising and falling of the channel voltage, although of course the relative magnitude of the two voltages will be different; and also the control terminal voltage has other contributions.

Figure 5:
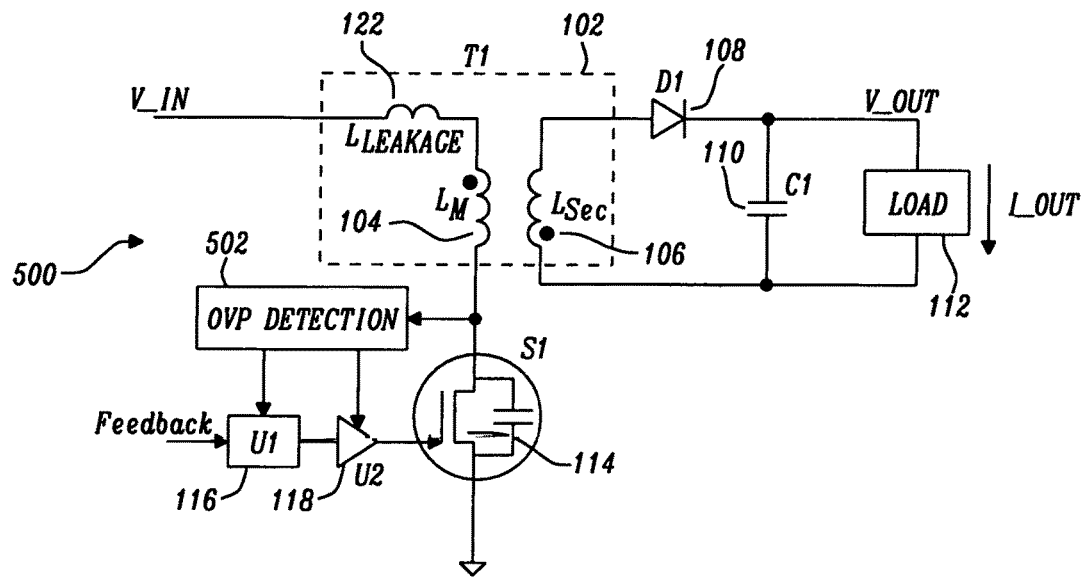
FIG. 5 shows a flyback converter in which an over-voltage protection circuit according to an embodiment of the disclosure is provided.

An illustrative embodiment of the disclosure is shown in FIG. 5. Here, a flyback converter 500 is shown, having a power transistor 114 (S1) protected with an over-voltage protection circuit 502 (OVP DETECTION). Various components of the converter of FIG. 5 correspond with those of FIG. 1, so like reference numerals are used to refer to like components and their operation will not be described again because it corresponds to that described above.

The over-voltage detection circuit 502 monitors the channel voltage of the transistor 114. When an over-voltage condition is detected, the transistor 114 can be placed in a conduction state, reducing the channel voltage to within safe operating conditions.

The over-voltage detection circuit 502 is illustrated in the figure as providing outputs for both the controller 116 and the driver 118 but in practice these will be used as alternative options. The circuit 500 can be provided with both connections and have one of them enabled at any one time, or it can be provided with either one of the connections.

In one example, the over-voltage detection circuit 502 provides an output to the controller 116. If an over-voltage condition is detected, the controller 116 may place the transistor 114 in its conducting state, even if the feedback signal does not warrant it.

In another example, the over-voltage detection circuit 502 provides an output directly to the driver 118. In this case, when an over-voltage condition is detected, the driver 118 may place the transistor 114 in its conducting state, thus over-riding the control signal of the controller 116. The implementation of the driver 118 can be made linear to the channel voltage in order to avoid oscillation effects.

When the transistor is operating within the rated operating conditions, the transistor 114 is placed in the ON and OFF states as determined by the control circuitry 116, 118. However, when an over-voltage condition is detected, the over-voltage protection circuit 502 over-rides the control circuitry 116, 118 and places the transistor 114 in an ON state, alleviating the over-voltage condition.

Figure 6:
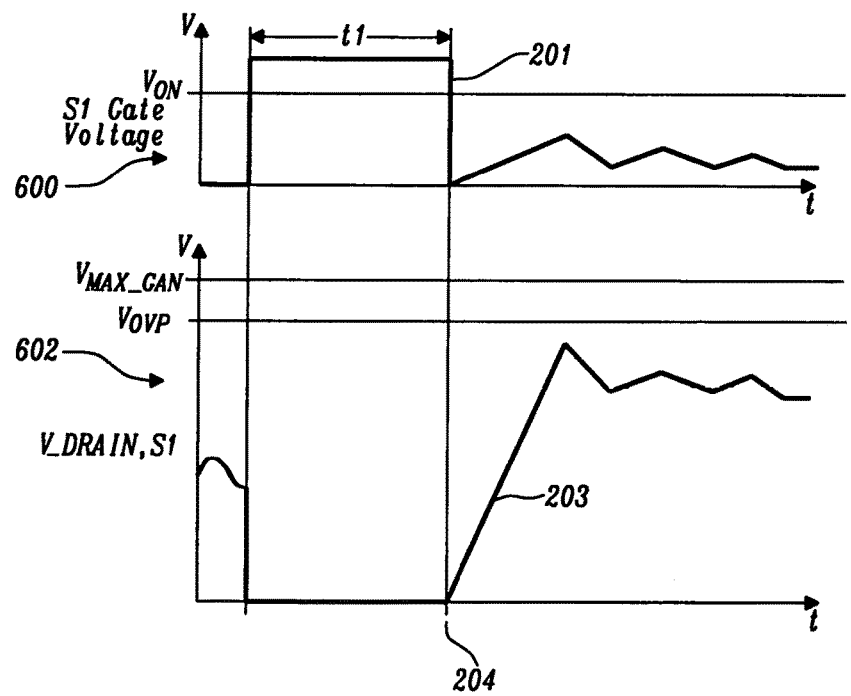
FIGS. 6 and 7 illustrate waveforms associated with the flyback converter 500 of FIG. 5.
Figure 7:
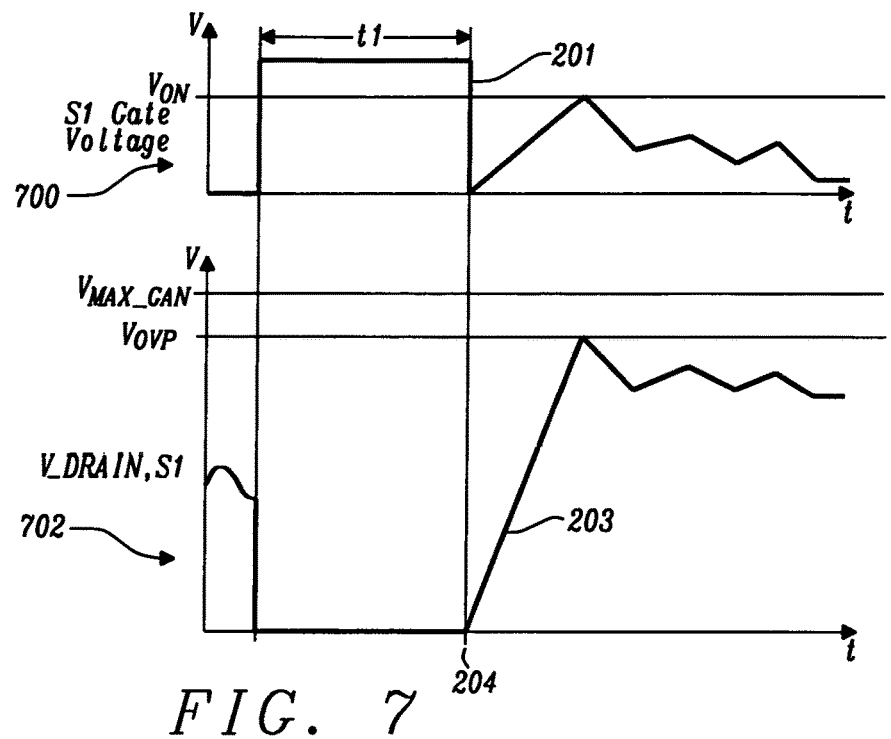

FIGS. 6 and 7 illustrate waveforms associated with the flyback converter 500 of FIG. 5. In a manner similar to that of FIGS. 2 and 4 above, first plots 600, 700 illustrate variation of a gate voltage 201 of the power transistor 114 (S1) over time, and second plots 602, 702 illustrate variation of a channel voltage 203 of the power transistor 114 (S1) over time.

As shown in FIGS. 6 and 7, the over-voltage protection circuit 502 allows the gate voltage of the transistor 114 to track the shape of the $V_{DS}$ voltage of the transistor 114 while the controller 116 has placed the transistor 114 in the OFF state.

An over-voltage threshold, $V_{OVP}$, is defined by the over-voltage protection circuit 502. $V_{OVP}$ is less than the maximum $V_{DS}$ rating of the transistor, $V_{MAX\_GAN}$. The over-voltage protection circuit 502 is arranged to provide a gate drive voltage that is equal to or above the "ON" threshold $V_{ON}$ when the channel voltage ($V_{DS}$) reaches the defined threshold $V_{OVP}$.

FIG. 6 illustrates an example where the $V_{DS}$ voltage of the transistor 114 never exceeds the over-voltage threshold $V_{OVP}$, and so the over-voltage protection circuit 502 does not override the control signal of controller 116. However, as shown in FIG. 7, if the $V_{DS}$ voltage of the transistor 114 does reach the over-voltage threshold $V_{OVP}$ while the transistor 114 is in the OFF state, the control terminal voltage (gate voltage $V_G$) at that point does reach the turn-on threshold voltage $V_{ON}$ and so the transistor 114 is switched to a conductive state, preventing the $V_{DS}$ voltage of the transistor 114 to exceed the maximum voltage rating $V_{MAX\_GAN}$. At this point, the over-voltage protection circuit 502 effectively over-rides the control signal of the controller 116. This behaviour effectively emulates the effect of an avalanche self-protection mechanism as shown above with reference to FIGS. 1 and 2, with the threshold $V_{OVP}$ that defines the level of protection being defined by the over-voltage protection circuit 502.

Figure 9:
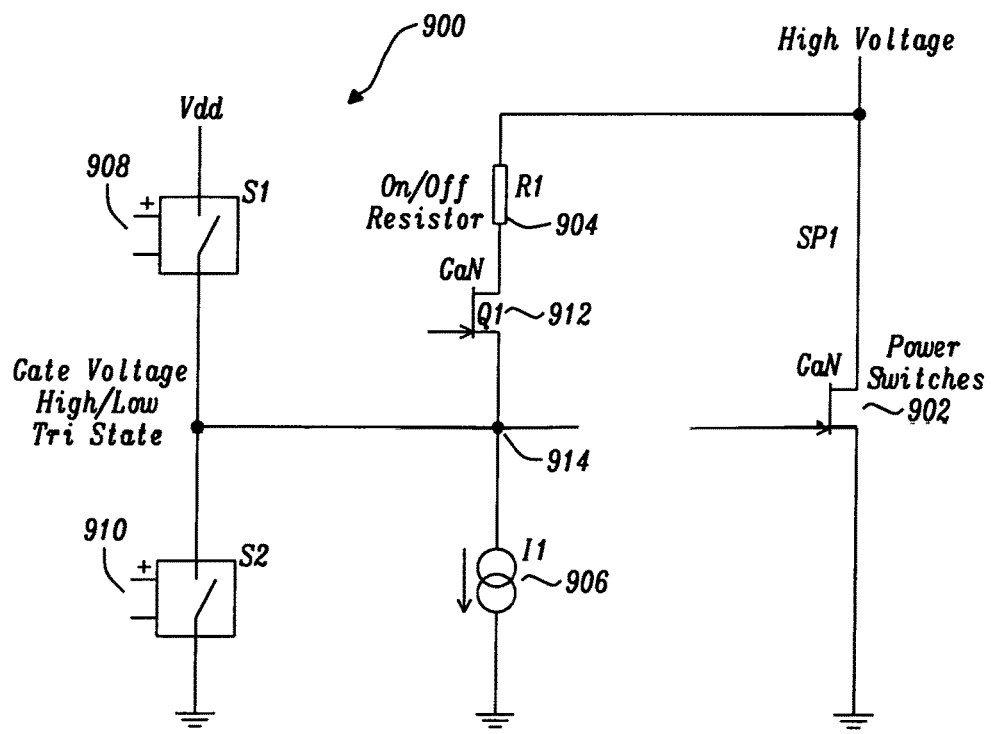
FIG. 9 shows an embodiment of an over-voltage protection circuit according to the disclosure.

Having the gate drive voltage of the transistor 114 track the transistor channel voltage does have a small negative impact on the operating efficiency of the transistor 114 because of power losses in the over-voltage protection circuit. For example, the power loss of a resistor 904 (as shown in FIG. 9 below) is approx. $V_{DS}^2/R$. R is highly resistive. To ameliorate this, the present disclosure can provide in an optional embodiment for the over-voltage protection function provided by the over-voltage protection circuit 502 to be selectively disabled. The over-voltage protection circuit 502 can be shorted or disabled when it can be determined that there is no or minimal danger of the transistor channel voltage exceeding the maximum rating ($V_{MAX\_GAN}$ in this example). For example, a given power converter circuit topology may have different modes of operation and it may be known that high $V_{DS}$ conditions only occur in certain modes. Therefore, the over-voltage protection circuit can be disabled when the other modes are active. It is also possible to switch the over-voltage protection circuit on only in certain critical phases (e.g. after going from ON- to OFF state).

Figure 8:
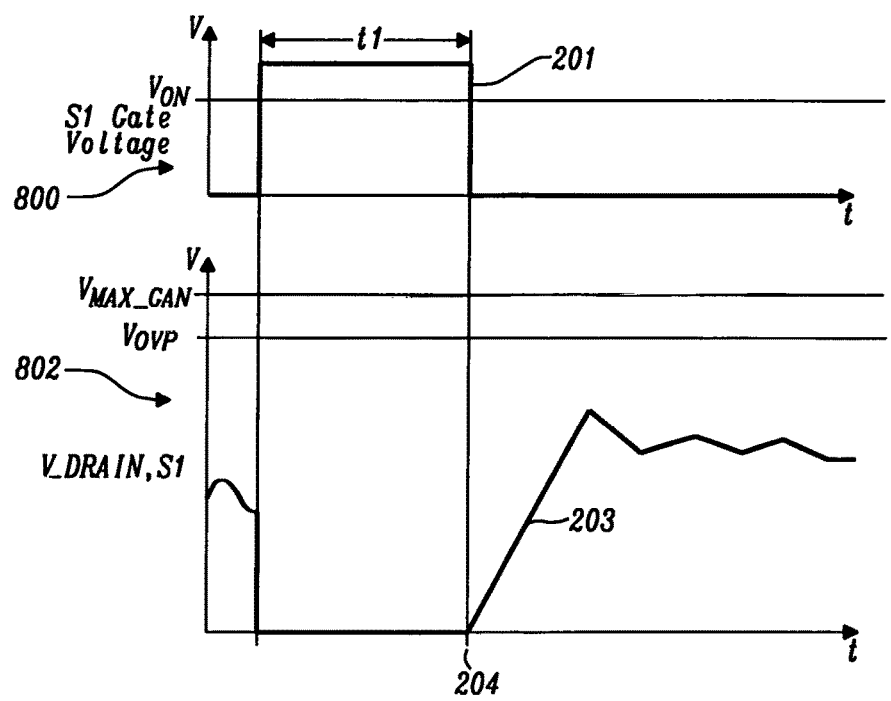
FIG. 8 shows waveforms associated with a flyback converter in which an over-voltage protection circuit is selectively disabled.

FIG. 8 illustrates waveforms associated with this principle. In a manner similar to the plots of the preceding figures, a first plot 800 illustrates variation of a gate voltage 201 of the power transistor 114 (S1) over time, and a second plot 802 illustrates variation of a channel voltage 203 of the power transistor 114 (S1) over time. Here, it is determined that there is no or minimal danger of the transistor channel voltage exceeding the maximum rating, and so the over-voltage protection circuit 502 is disabled and the gate voltage 201 does not track the variation of the channel voltage 203.

An embodiment of an over-voltage protection circuit 900 according to the disclosure is shown in FIG. 9, arranged to protect a transistor device 902 (SP1). As mentioned above, the disclosure provides over-voltage protection by feeding back a level-shifted version of a channel voltage as an input contribution to the control terminal. Therefore, an over-voltage protection circuit according to the disclosure provides a level shifter arranged to provide this capability. A level shifter can take various different forms, but in a preferred embodiment comprises components which are provided together with the transistor as part of the same integrated circuit.

In the example embodiment shown in FIG. 9, the level shifter comprises a voltage divider formed by a resistive component 904 (R1) and current source 906 (I1) so that a voltage derived from the channel voltage ($V_{DS}$) of the transistor 902 is fed back via a divider output 914 to the control terminal, providing a contribution to the control terminal voltage ($V_G$). The values of the current I1 provided by the current source 906 and resistance R1 provided by the resistive component 904 define an active effective Zener voltage. In case of the high drain voltage the gate voltage of the switch reaches the threshold and the switch will be activated.

Figure 10:
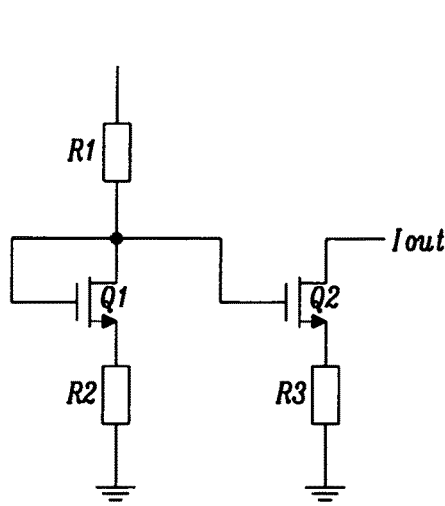
FIGS. 10 and 11 show two current source examples which can be used with the circuit of FIG. 9.
Figure 11:
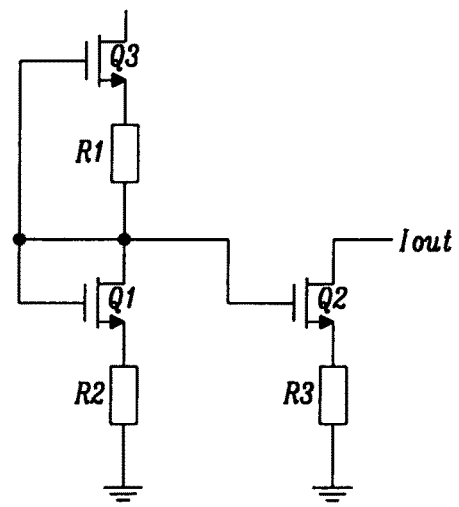

The current source 906 can comprise any components that are suitable for generating a constant current for varying voltages which are applied across it. There are many different ways of constructing a current source which are well known. As a simple example, a current source could be constructed from a FET with its gate attached to its source to form a constant current diode. Two current source examples are shown in FIGS. 10 and 11. These are provided for illustration only and provide their outputs IOUT as the I1 current mentioned above.

In this example circuit, the power transistor 900 is driven by a high side switch 908 (S1) and a low side switch 910 (S2) and can be switched in a tri-state fashion. The drive impedances of the high and low side switches 908, 910 must be selected to allow the over-voltage protection circuit 900 to operate, or use a mechanism that detects the threshold of the protection circuitry 900 and drives the gate voltage accordingly.

The circuit 900 may be optionally provided with a selector switch 912 (Q1) which can be selectively turned off in order to reduce power losses caused by the resistive component 904 and the current source 906. This switch 912 provides a mechanism to selectively disable the over-voltage protection circuit 900, in the same way as shown above with respect to FIG. 8.

FIG. 9 further illustrates that the protection circuit 900 does not require the use of a Zener diode. This is especially useful when implemented in a GaN process, as no Zener structure is available.

Furthermore, the use of a resistive component such as a resistor and a current source means that the over-protection circuit 900 can be provided together with the transistor 902 as part of the same integrated circuit. No external components are required.

A current source 906 can also be easily adjusted or trimmed during a manufacturing process, or can be provided as a programmable current source 906 for dynamic adjustment. This provides improved flexibility as compared with the use of an external diode or a Zener structure protection circuit. For example, process or temperature variations of the resistor 904 can be accommodated by adjustment of the current I1.

The transistor 902 together with the over-voltage protection circuit 900 effectively acts in a manner similar to a Zener diode.

Figure 12:
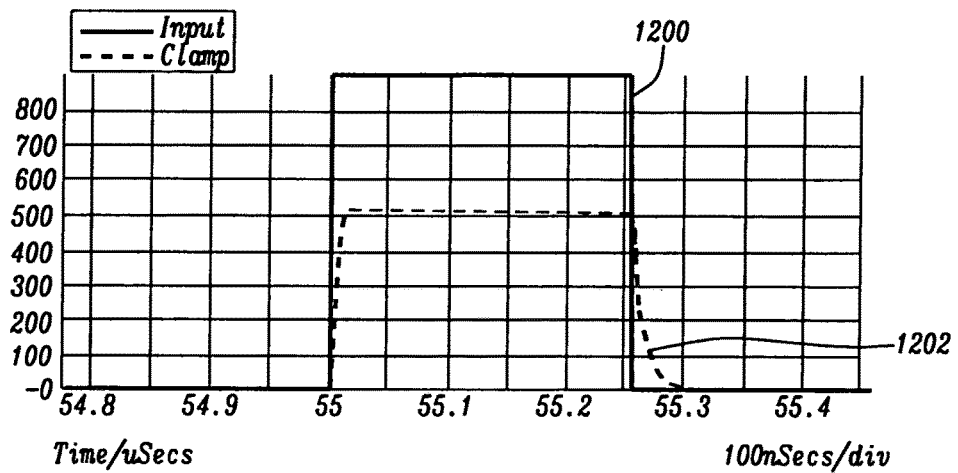
FIG. 12 shows a simulation of a clamping concept with current source and resistor as shown in the circuit of FIG. 9.

FIG. 12 shows the simulation of the clamping concept with current source 906 and resistor 904 as shown in the FIG. 9, plotting V_IN voltage against time. When an input high voltage pulse 1200 is applied to the channel of the transistor and the $V_{DS}-I*R>V_{ON}$, ($V_{ON}$ being a gate-source threshold voltage) the transistor 114 will start to conduct and reduce the Vim to a clamped value where $V_{GS}=V_{DS}-I*R$ (assumed no ideal voltage source is connected on MOSFET drain). The operation of the clamping mechanism is shown by chart 1202. The current during the time can be measured in the source of the transistor and so the system knows the critical conditions.

The avoidance of external components and Zener structures is of particular utility for GaN devices as explained above. However, the disclosure also has utility for standard MOSFET devices as it will limit transient voltages across a switching device.

As described above, an over-voltage threshold, $V_{OVP}$, is defined by the over-voltage protection circuit 502, 900. When the channel voltage of the transistor 114, 902 exceeds this over-voltage threshold, a control terminal voltage reaches the turn-on threshold voltage $V_{ON}$ of the transistor 114, 902. The value of the over-voltage threshold $V_{OVP}$ depends on the ratings of the components which form the over-voltage protection circuit 502, 900 which in the example of the circuit of FIG. 9 are the current I1 provided by the current source 906 and the resistance R1 of the resistive component 904.

According to an aspect of the disclosure, the over-voltage threshold $V_{OVP}$ may be adaptive, that is, it can be programmed or otherwise changed by a designer or user of a circuit, or adapted to have different values in different operational stages of the over-voltage protection circuit.

Figure 13:
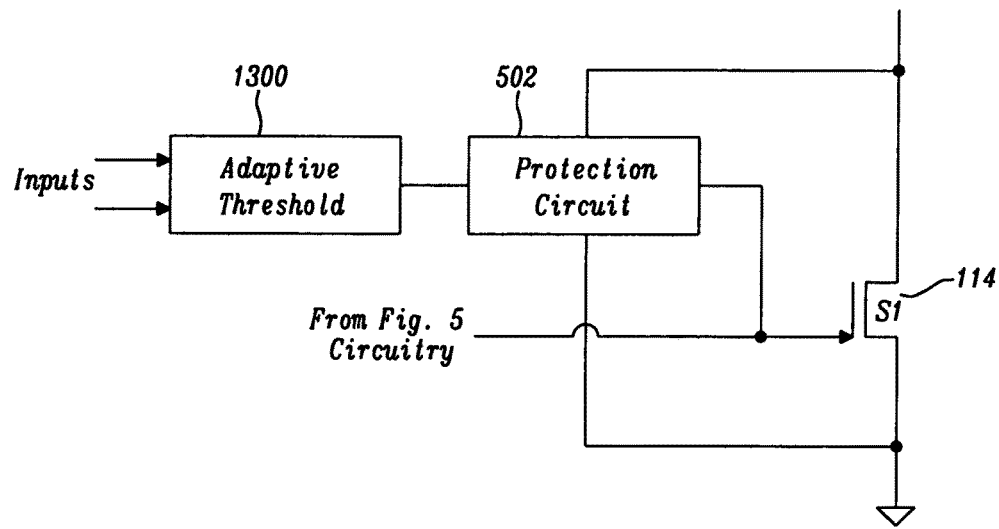
FIG. 13 shows an example of an adaptive threshold over-voltage protection circuit.

FIG. 13 shows an example of how an adaptive threshold over-voltage protection circuit may be provided, shown here incorporated with the transistor 114 (S1) of FIG. 5. The remainder of the components of FIG. 5 have been omitted for clarity. Here, an adaptive threshold circuit 1300 monitors specific parameters and sets the over-voltage threshold $V_{OVP}$ that is used by the over-voltage protection circuit 502.

Figure 14:
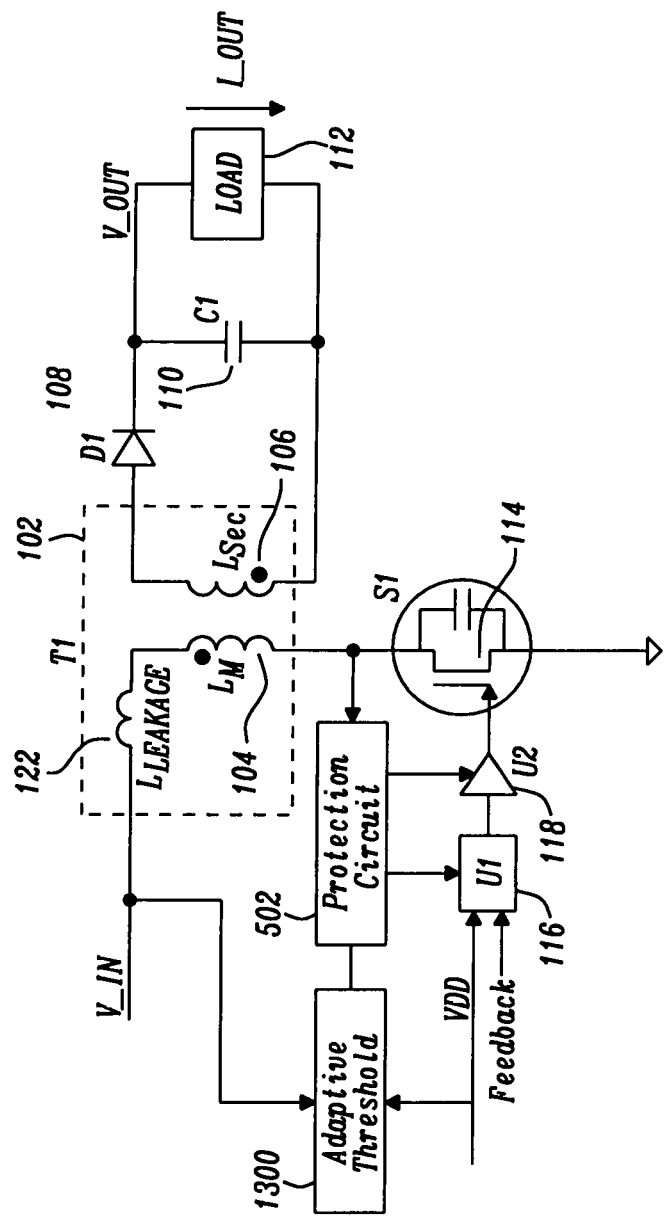
FIG. 14 shows an example of parameters that can be monitored in the operation of the adaptive threshold over-voltage protection circuit of FIG. 13.

Various different parameters may be monitored by the adaptive threshold circuit 1300 in order to make an adjustment to the over-voltage threshold $V_{OVP}$. FIG. 14 shows an example of some of the parameters that can be measured, for a flyback circuit similar to that of FIG. 5. Here, the adaptive threshold circuit 1300 monitors the presence of a drain supply voltage $V_{DD}$ to a controller 116 (U1) and the input voltage V_IN of the power converter.

Figure 15:
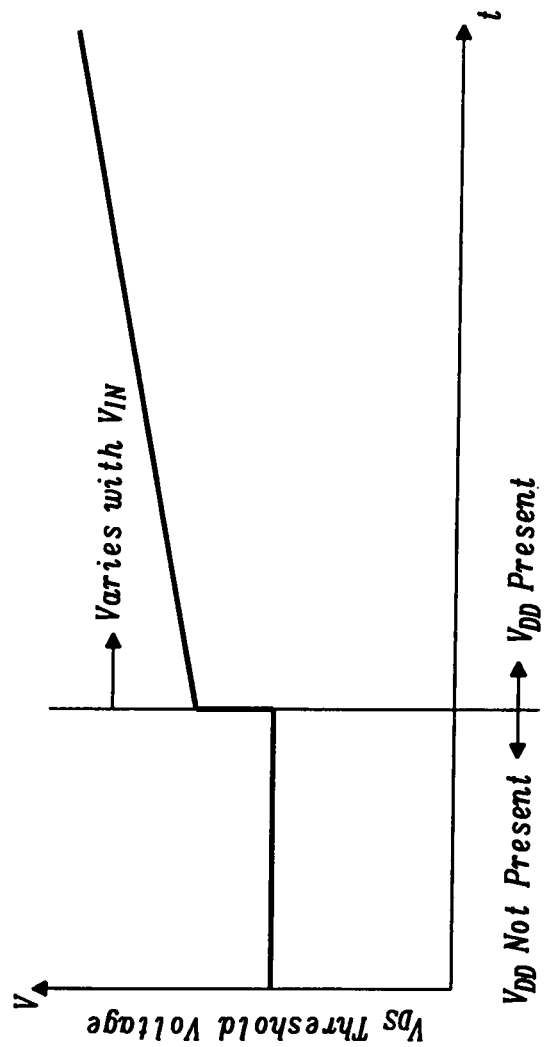
FIG. 15 shows an implementation example of the adaptive threshold.

As shown in FIG. 15, if the $V_{DD}$ voltage to the controller 116 (U1) is not detected, the power converter is deemed not to be in an operational mode and so no switching of the transistor 114 is initiated, resulting in a first pre-set fixed threshold value of the over-voltage threshold $V_{OVP}$. For example, this operation is very useful for switch devices used in electrostatic discharge (ESD) structures. If presence of a $V_{DD}$ voltage is detected, and the power converter is placed in the operational mode, the input voltage of the power converter is monitored. The over-voltage threshold $V_{OVP}$ for the transistor 114 may then vary based on the input voltage. In this case, protection of the transistor 114 is optimized while ensuring proper operation of the power converter.

Various modifications and improvements can be made to the above without departing from the scope of the disclosure.

In particular, it is to be appreciated that the disclosure may apply to any type of transistor, including those which do have avalanche capabilities and provide Zener structures (such as silicon MOSFET devices) as well as those which do not have avalanche capabilities and/or which do not provide Zener structures (such as GaN devices). Also, the flyback converters are only for illustration and it will be appreciated that the principles of the disclosure can apply for the protection of transistors in any type of device, including without limitation generally all other power converter topologies.

What is claimed is:

1. A circuit comprising:
   a transistor comprising a control terminal, a first current carrying terminal and a second current carrying terminal; and
   an over-voltage protection circuit comprising:
      a level shifter arranged to feed back a level-shifted version of a channel voltage between said first and second current carrying terminals to the control terminal;
      wherein the level shifter is configured so that a switching threshold voltage of the transistor is crossed when a predetermined value of the channel voltage is crossed.

2. The circuit of claim 1, wherein the level shifter comprises components which are provided together with the transistor as part of the same integrated circuit.

3. The circuit of claim 1, wherein the level shifter comprises a resistive component and a current source arranged to provide a divided voltage version of the channel voltage; and the level shifter is configured according to the ratings of the resistive component and the current source.

4. The circuit of claim 1, wherein a control terminal voltage tracks the variation of the channel voltage.

5. The circuit of claim 1, wherein the level shifter is coupled directly the control terminal.

6. The circuit of claim 1, further comprising a controller arranged to provide control signals to the control terminal, and wherein an output of the level shifter is coupled to said controller.

7. The circuit of claim 1, further comprising a driver for driving the control terminal and wherein an output of the level shifter is coupled to said driver.

8. The circuit of claim 1, further comprising a selector switch which is operable to selectively enable or disable the over-voltage protection circuit.

9. The circuit of claim 1, wherein the predetermined value of the channel voltage is adaptable.

10. The circuit of claim 8, wherein the predetermined value of the channel voltage is adjusted based on detection of the presence of a supply voltage.

11. The circuit of claim 8, wherein the predetermined value of the channel voltage is adjusted based on the value of a system input voltage.

12. The circuit of claim 11, wherein the predetermined value of the channel voltage increases with increasing system input voltage.

13. The circuit of claim 1, wherein the transistor is a GaN device.

14. A power converter circuit comprising:
    a power transistor comprising a control terminal, a first current carrying terminal and a second current carrying terminal; and
    an over-voltage protection circuit comprising:
       a level shifter arranged to feed back a level-shifted version of a channel voltage between said first and second current carrying terminals to the control terminal;
       wherein the level shifter is configured so that a switching threshold voltage of the transistor is crossed when a predetermined value of the channel voltage is crossed.

15. A method of protecting a transistor from an over-voltage condition, said transistor being of the type comprising a control terminal, a first current carrying terminal and a second current carrying terminal; the method comprising the steps of:
    feeding back a level-shifted channel voltage between said first and second current carrying terminals to the control terminal; and
    switching the transistor on once a predetermined value of the channel voltage is crossed.

16. The method of claim 15, wherein the level shifter comprises components which are provided together with the transistor as part of the same integrated circuit.

17. The method of claim 15, wherein the level shifter comprises a resistive component and a current source arranged to provide a divided voltage version of the channel voltage; and the level shifter is designed according to the ratings of the resistive component and the current source.

18. The method of claim 15, wherein a control terminal voltage tracks the variation of the channel voltage.

19. The method of claim 15, wherein the level shifter is coupled directly the control terminal.

20. The method of claim 15, further comprising the steps of:
    providing control signals to the control terminal by a controller, and
    coupling an output of the level shifter to said controller.

21. The method of claim 15, further comprising the steps of:
    driving the control terminal with a driver, and
    coupling an output of the level shifter to said driver.

22. The method of claim 15, further comprising the step of:
selectively enabling or disabling the over-voltage protection circuit by a selector switch.

23. The method of claim 15, wherein the predetermined value of the channel voltage is adaptable.

24. The method of claim 22, wherein the predetermined value of the channel voltage is adjusted based on detection of the presence of a supply voltage.

25. The method of claim 22, wherein the predetermined value of the channel voltage is adjusted based on the value of a system input voltage.

26. The method of claim 25, wherein the predetermined value of the channel voltage increases with increasing system input voltage.

27. The method of claim 15, wherein the transistor is a GaN device.

\* \* \* \* \*